United States Patent
Plissonneau et al.

(10) Patent No.: US 12,359,091 B2
(45) Date of Patent: Jul. 15, 2025

(54) LIQUID DISPERSION AND POWDER OF CERIUM BASED CORE-SHELL PARTICLES, PROCESS FOR PRODUCING THE SAME AND USES THEREOF IN POLISHING

(71) Applicant: RHODIA OPERATIONS, Lyons (FR)

(72) Inventors: Marie Plissonneau, Paris (FR); Réka Toth, Paris (FR); Thierry Le Mercier, Rosny-sous-Bois (FR); Valérie Buissette, Paris (FR); Lauriane D'Alencon, Issy-les-Moulineaux (FR)

(73) Assignee: RHODIA OPERATIONS, Lyons (FR)

( * ) Notice: Subject to any disclaimer, the term of this patent is extended or adjusted under 35 U.S.C. 154(b) by 283 days.

(21) Appl. No.: 17/780,462

(22) PCT Filed: Nov. 25, 2020

(86) PCT No.: PCT/EP2020/083297
§ 371 (c)(1),
(2) Date: May 26, 2022

(87) PCT Pub. No.: WO2021/105169
PCT Pub. Date: Jun. 3, 2021

(65) Prior Publication Data
US 2023/0002639 A1    Jan. 5, 2023

(30) Foreign Application Priority Data
Nov. 26, 2019    (EP) ..................... 19306524

(51) Int. Cl.
*C09G 1/02*    (2006.01)
*H01L 21/321*    (2006.01)

(52) U.S. Cl.
CPC ............ *C09G 1/02* (2013.01); *H01L 21/3212* (2013.01)

(58) Field of Classification Search
CPC ..... C09G 1/02; H01L 21/3212; H01L 21/304; H01L 21/30625; C09K 3/1463; C09K 3/1436; B24B 1/00
(Continued)

(56) References Cited

U.S. PATENT DOCUMENTS

| | | |
|---|---|---|
| 4,657,644 A | 4/1987 | Bachot et al. |
| 2002/0177311 A1 | 11/2002 | Schumacher et al. |

(Continued)

FOREIGN PATENT DOCUMENTS

| | | |
|---|---|---|
| FR | 2570087 A1 | 3/1986 |
| JP | 2002356312 A | 12/2002 |

(Continued)

OTHER PUBLICATIONS

International Search Report issued in International Application No. PCT/EP2020/083297, mailed Dec. 10, 2020 (4 pages).

(Continued)

*Primary Examiner* — Duy Vu N Deo
(74) *Attorney, Agent, or Firm* — Osha Bergman Watanabe & Burton LLP

(57) ABSTRACT

The invention relates to cerium based core-shell particles having a core of cerium oxide optionally doped with at least one metal (M) and a shell consisting of a plurality of nanoparticles of cerium oxide optionally doped with at least one metal (M'), which can be the same or different from metal (M), formed on the surface of the core particle. The invention also relates to dispersions thereof in a liquid medium, to a process for producing the same and to the use of these particles and dispersions in polishing applications such as chemical mechanical polishing.

15 Claims, 4 Drawing Sheets

(58) Field of Classification Search
USPC .............................. 438/690–693; 51/307–309
See application file for complete search history.

(56) References Cited

U.S. PATENT DOCUMENTS

| | | |
|---|---|---|
| 2010/0003897 A1 | 1/2010 | Kim et al. |
| 2010/0072417 A1 | 3/2010 | Criniere |
| 2011/0225897 A1 | 9/2011 | Criniere et al. |
| 2013/0109600 A1* | 5/2013 | Reed .................... C10M 125/10 977/890 |
| 2016/0272860 A1* | 9/2016 | Mizoguchi ........... C09K 3/1463 |
| 2017/0210958 A1 | 7/2017 | Shinoda et al. |
| 2017/0292038 A1 | 10/2017 | Doi et al. |
| 2019/0211245 A1* | 7/2019 | Choi .................... C09K 3/1436 |
| 2024/0247169 A1* | 7/2024 | Plissonneau ............. C09G 1/02 |

FOREIGN PATENT DOCUMENTS

| | | |
|---|---|---|
| JP | 2016084251 A | 5/2016 |
| JP | 2021014375 A | 2/2021 |
| WO | 2005035688 A1 | 4/2005 |
| WO | 2008043703 A2 | 4/2008 |
| WO | 2010020466 A1 | 2/2010 |
| WO | 2013067696 A1 | 5/2013 |
| WO | 2015091495 A1 | 6/2015 |
| WO | 2015197656 A1 | 12/2015 |
| WO | 2016006553 A1 | 1/2016 |
| WO | 2016047725 A1 | 3/2016 |
| WO | 2016140968 A1 | 9/2016 |
| WO | 2016141259 A1 | 9/2016 |
| WO | 2016141260 A1 | 9/2016 |
| WO | 2018229005 A1 | 12/2018 |

OTHER PUBLICATIONS

Written Opinion issued in International Application No. PCT/EP2020/083297, mailed Dec. 10, 2020 (6 pages).
Stephen Brunauer, P. H. Emmett, Edward Teller—Adsorption of Gases in Multimolecular Layers—J. Am. Chem. Soc. 1938, 60, 2, 309-319—doi: 10.1021/ja01269a023 (11 pages).

* cited by examiner

LIQUID DISPERSION AND POWDER OF CERIUM BASED CORE-SHELL PARTICLES, PROCESS FOR PRODUCING THE SAME AND USES THEREOF IN POLISHING

This application is a national stage entry of International Patent Application No. PCT/EP2020/083297, filed Nov. 25, 2020, which claims priority to European Patent Application No. 19306524.0, filed on 26 Nov. 2019, the whole contents of these applications being incorporated herein by reference for all purposes.

TECHNICAL FIELD

The present invention relates to a process for producing a dispersion of cerium based core-shell particles, to the dispersions and powders obtainable by such a process, and to their use in the field of polishing, especially chemical mechanical polishing.

BACKGROUND ART

Ceric oxides are commonly used for polishing applications, especially chemical mechanical polishing. The development of the electronics industry requires an increasingly considerable use of compositions for polishing various parts such as discs or dielectric compounds. These compositions, which are generally in the form of dispersions, must exhibit a certain number of characteristics. For example, they must offer a high degree of removal of material, which reflects their abrasive capacity. They must also have a defectuosity which is as low as possible; the term "defectuosity" is intended to mean in particular the amount of scratches exhibited by the substrate once treated with the composition. For reasons of stability and of ease of use, these dispersions must comprise particles of submicronic dimensions, i.e. generally less than 300 nm. In addition, the presence of particles that are too fine in these dispersions reduces their abrasive capacities, and particles that are too large can contribute to an increase in the defectuosity.

In this context, we believe that there is a need for cerium based particles having improved abrasive properties when used in a chemical mechanical polishing process. There is also a need for a making process thereof which is simple and easy to implement at an industrial scale.

BRIEF DESCRIPTION OF THE INVENTION

These problems are solved by the present invention which offers inter alia new cerium based particles having a rough surface thanks to a specific core-shell morphology and a making process thereof.

One object of the invention thus relates to a process for producing a dispersion of cerium based core-shell particles in a liquid, comprising the following steps:
(a) providing an aqueous dispersion comprising particles of cerium oxide optionally doped with at least one metal (M); providing an aqueous solution comprising a cerium (III) salt; and optionally providing an aqueous solution comprising at least one metal (M') salt;
(b) contacting, under oxidizing atmosphere, the aqueous dispersion with the aqueous solution(s) provided in step (a), while maintaining the temperature comprised between 0° C. and 80° C. and the pH lower or equal to 11, to produce the dispersion of cerium based core-shell particles;

at least one of the steps (a) and (b) being carried out in the presence of nitrate ions.

The invention also relates to the cerium based core-shell particles and dispersions thereof obtainable or obtained by this process.

A cerium based core-shell particle of the invention can be described as a core particle of cerium oxide optionally doped with at least one metal (M) and a shell consisting of a plurality of nanoparticles of cerium oxide optionally doped with at least one metal (M'), said nanoparticles being formed on the surface of the core particle, wherein the ratio of the average size of the core-shell particles measured by TEM to the average size of the core-shell particles measured by BET is of at least 1.5.

Advantageously, the specific core-shell morphology of the particles of the invention increases their surface roughness and thus their surface specific area by comparison with smooth cerium oxide particles not having a shell in accordance with the present invention. Accordingly, by increasing the contact surface between the particles and the substrate to be polished, the abrasive properties of the core-shell particles of the invention are improved, allowing to advantageously use them in a chemical mechanical polishing process. The core-shell particles dispersions of the invention especially allow a higher removal rate due to their rough surface while maintaining the same defectivity thanks to equivalent size distributions compared to dispersions of smooth surface cerium oxide particles having no shell in accordance with the present invention.

The dispersions of cerium based core-shell particles of the invention can be used to prepare powders of cerium based core-shell particles, as well as polishing compositions, as it will be detailed hereafter in the specification.

Additionally, one advantage of the core-shell particles of the invention is that the nanoparticles from the shell are well attached to the core particle. It has notably been observed that they remain attached to the core during the whole chemical mechanical polishing process in which they are implemented. It is all the more important since the particles shells withstand the mechanical stress during the chemical mechanical polishing process. If the nanoparticles of the shell came off during the polishing, these small cerium oxide particles could remain attached to the substrate even after a washing step, which is not acceptable by the end users. It would result in unacceptable costs due to the substrate loss and the recurrent polishing composition replacement.

Another advantage of the core-shell particles of the invention lies in the fact they have the adapted size range for the CMP application and are monodisperse.

FIGURES

Figure 1:
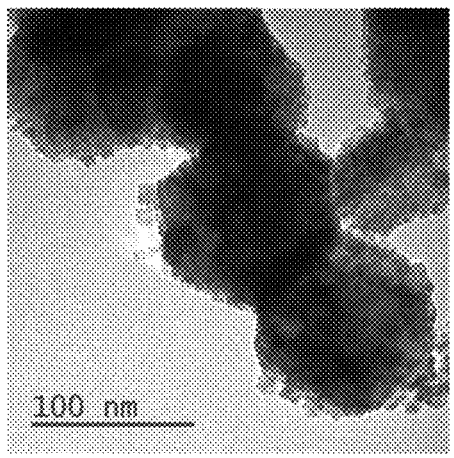
FIG. 1 is a TEM pictures of a dispersion of the core-shell particles of the invention obtained by the process illustrated in example 1, having a cerium oxide core and a cerium oxide shell.

Transmission electron microscopy (TEM) images were collected using JEM-1400 (JEOL) operating at 120 kV. Scanning electron microscopy (SEM) images were obtained with a SEM S-5500 of Hitachi High Technologies Corporation.

Definitions

In the present disclosure, the expression "comprising" should be understood as meaning "comprising at least one".

When referring to the aqueous dispersion or solution provided in step (a) and (b) of the process of the invention, the expression "comprising" encompasses the embodiments wherein said dispersion and solution "consist of" the compounds described in connection thereof.

The expression "comprised between . . . and . . . " should be understood as including the limits.

In the whole description, the term "cerium based" encompasses cerium oxide and metal doped cerium oxide. Cerium oxide generally has a purity degree of at least 99.8% by weight with respect to the weight of the oxide. Cerium oxide is generally crystalline ceric oxide. The term "cerium oxide doped with at least one metal" means that metal ions partially replace the cerium ions in the $CeO_2$ lattice. Therefore, it also denotes a mixed oxide of cerium and at least one metal. It may also denote, in some embodiments, a solid solution. In that case, the metal atoms are intimately diffused into the cerium oxide crystalline structure. Some impurities other than said metal can be present in the oxide. The impurities may stem from the raw materials or starting materials used in the process of preparation of the metal doped oxide. The total proportion of the impurities is generally lower than 0.2% by weight with respect to the metal doped oxide. Residual nitrates are not considered as impurities in this application.

The expression "dispersion" in connection with dispersions of cerium based particles denotes a system consisting of solid fine particles of submicronic dimensions, stably dispersed in a liquid medium, it being possible for said particles to also optionally contain residual amounts of bound or adsorbed ions such as, for example, nitrates or ammoniums.

The term "nanoparticle" in connection with the plurality of small particles forming the shell of the core-shell particles of the invention means that these small particles have an average particle size comprised between 1 and 100 nm. It can especially be determined by TEM as explained hereinafter.

Different parameters may be used to characterize the sizes and the distribution of sizes of:
- the whole core-shell particles of the invention;
- the core particles, notably by characterizing the particles provided in the dispersion of step (a) of the process of the invention;
- the nanoparticles from the shell.

In connection with dispersions of particles:
- the average size of n (>100) particles may be measured using a photograph of dispersions thereof obtained by transmission electron microscopy (TEM);
- the standard deviation mentioned in the present application is also determined from the TEM method. It has its usual mathematical meaning. It is the square root of the variance and is expressed by the formula:

$$\sigma = \sqrt{\frac{1}{n}\sum_{i=1}^{n}(x_i - \overline{x})^2}$$

n being the number of particles taken into account in the measurement, $x_i$ being the size of a particle i, $\overline{x}$ being the average value of the size of the particles ($1/n \ \Sigma_i x_i$).

In connection with particles in the powder form (dried particles):
- the average size of the particles may be determined by the X-ray diffraction (XRD) technique. The value measured by XRD corresponds to the size of the coherent range calculated based on the breadth of the two most intense diffraction lines and using the Scherrer model;
- the specific surface area may be determined on a powder by adsorption of nitrogen by the Brunauer-Emmett-Teller method (BET method). The method is disclosed in standard ASTM D 3663-03 (reapproved 2015). The method is also described in the periodical "The Journal of the American Chemical Society, 60, 309 (1938)". The specific surface area may be determined automatically with an appliance TriStar 3000 of Micromeritics according to the guidelines of the constructor. Prior to the measurement, the samples in the form of powders shall be degassed under static air by heating at a temperature of at most 210° C. to remove the adsorbed species.
- the average size of particles estimated by BET is the theoretical average size of the particles obtained from the specific surface area measured by the BET method and assuming the particles are non-porous spherical particles of cerium oxide having a density of 7.2.

The distribution of sizes of the particles may be characterized by various parameters. Said parameters are based on distributions by volume and not by number:
- the hydrodynamic mean diameter Dh which is equivalent to a median diameter D50 of the particles may be determined by dynamic light scattering (DLS). This technique allows measurement of the hydrodynamic mean diameter Dh of the solid objects, the value of which is affected by the presence of aggregates of particles. Therefore, the measurement is usually performed on a dispersion of the particles in water. Dh is determined with the appliance Zetasizer Nano-ZS of Malvern following the guidelines of the constructor. The sample usually needs to be diluted in deionized water. A dilution factor of ×30 000 may be applied;

laser diffraction may also be used to determine the distribution of sizes of the particles. A laser particle sizer like Horiba LA-910 may be used following the guidelines of the constructor. For the measurement, a relative refractive index of 1.7 may be used. From the distribution in volume obtained by laser diffraction, various parameters usually used in statistics like D10, D50, D90 and dispersion index may be deducted.

D10 is the diameter determined from a distribution obtained by laser diffraction for which 10% of the particles have a diameter of less than D10.

D50 is the median diameter determined from a distribution obtained by laser diffraction.

D90 is the diameter determined from a distribution obtained by laser diffraction for which 90% of the particles have a diameter of less than D90.

The "dispersion index" is defined by the following formula $\sigma/m=(D90-D10)/2D50$.

DESCRIPTION OF THE INVENTION

The present invention relates to a process for producing a dispersion of cerium based core-shell particles in a liquid, preferably water, comprising the following steps:

(a) providing an aqueous dispersion comprising particles of cerium oxide optionally doped with at least one metal (M); providing an aqueous solution comprising a cerium (III) salt; and optionally providing an aqueous solution comprising at least one metal (M') salt;

(b) contacting, under oxidizing atmosphere, the aqueous dispersion with the aqueous solution(s) provided in step (a), while maintaining the temperature comprised between 0° C. and 80° C. and the pH lower or equal to 11, to produce the dispersion of cerium based core-shell particles;

at least one of the steps (a) and (b) being carried out in the presence of nitrate ions.

Aqueous Dispersion Provided in Step (a)

The particles of cerium oxide optionally doped with at least one metal (M) are provided to serve as core particles for the cerium based core-shell particles to be produced according to the process of the invention.

In the following detailed description of step (a), these particles will be referred to as "cerium based particles" unless otherwise specified.

The starting dispersion used in step (a) can be prepared by dispersing, in water, commercially available powders of cerium based particles. Alternatively, commercially available dispersions of cerium based particles can be used. If necessary, these dispersions may be concentrated or diluted, and/or transferred from their original organic phase to water in order to implement step (a), by methods known per se.

The dispersion used in step (a) may comprise at least 3 wt %, in particular at least 5 wt %, at least 10 wt %, at least 15 wt %, even more particularly at least 20 wt %, of cerium based particles relative to the total weight of the dispersion. The yield of the reaction will be all the more improved. The dispersion used in step (a) may comprise less than 50% wt, in particular less than 40% wt, more particularly less than 35% wt of cerium based particles relative to the total weight of the dispersion.

According to one embodiment, the cerium based particles used in step (a) are cerium oxide particles, especially ceria particles. Such particles may advantageously be manufactured by one of the processes described by the Applicant in WO 2008/043703, WO 2010/020466 and WO 2015/091495.

Such cerium oxide particles (and thus core particles) may exhibit:

an average particles size measured by TEM of at most 250 nm, in particular at most 200 nm more particularly at most 170 nm; an average particles size measured by TEM of at least 30 nm, in particular at least 40 nm, more particularly at least 50 nm. The standard deviation of the value of said average particles size may be of at most 30%, particularly of at most 20%, more particularly of at most 15%; and/or an average particles size calculated from BET surface measurement of at most 120 nm, particularly of at most 110 nm; an average particles size calculated from BET surface measurement of at least 15 nm, in particular of at least 19 nm, in particular of at least 30 nm, in particular of at least 40 nm; and/or a median diameter D50, determined from a distribution obtained by laser diffraction, comprised between 60 nm and 170 nm, particularly between 70 nm and 160 nm, more particularly between 80 nm and 150 nm, even more particularly between 90 nm and 150 nm; and/or a dispersion index, determined from a distribution obtained by laser diffraction, of at most 0.5, particularly of at most 0.4, more particularly of at most 0.3.

According to another embodiment, the cerium based particles used in step (a) are cerium oxide particles which are doped with at least one metal (M). Such particles may be advantageously manufactured by one of the processes described by the Applicant in WO 2015/197656 and WO 2018/229005.

According to this embodiment, said metal (M) may be more particularly chosen from the group consisting of alkali metal elements, alkaline earth metal elements, rare earth elements, actinide elements, transition metal elements and post transition metal elements, from the Periodic Table.

The expression "rare earth" is understood to mean the elements from the group made up of yttrium and the elements from the Periodic Table with atomic numbers between 57 and 71 inclusive. Transition metal elements are defined as any element in the d-block of the Periodic Table, which includes groups 3 to 12 on the periodic table. Post transition metal elements, also known as poor metal, are defined as metallic elements in the p-block of the Periodic Table, notably aluminium, gallium, indium, thallium, tin, lead, bismuth and polonium.

Preferably, said at least one metal (M) is chosen from the group consisting of transition metal elements, such as Zr; post transition metal elements, such as Al; rare earth elements, such as La, Pr, Nd and Y; and alkaline earth metal elements, such as Sr. More preferably, said at least one metal (M) is chosen from the group consisting of lanthanum, praseodymium, neodymium and zirconium. Still more preferably, said at least one metal (M) is chosen from the group consisting of lanthanum, praseodymium and neodymium. Even more preferably, said at least one metal (M) is lanthanum.

Still according to this embodiment, the molar ratio M/M+Ce in the metal (M) doped cerium oxide particles used in step (a) may be comprised between 0.01 and 0.15, more particularly between 0.01 and 0.13, in particular between 0.01 and 0.12.

Such metal (M) doped cerium oxide particles may exhibit:

an average particles size measured by TEM of at most 250 nm, in particular at most 200 nm more particularly at most 170 nm; an average particles size measured by TEM of at least 30 nm, in particular at least 40 nm, more particularly at least 50 nm. The standard deviation of the value of said average particles size may be of at most 30%, particularly of at most 20%, more particularly of at most 15%; and/or an average particles size calculated from BET surface measurement of at most 120 nm, particularly of at most 110 nm; an average particles size calculated from BET surface measurement of at least 15 nm, in particular of at least 19 nm, of at least 30 nm, in particular of at least 40 nm; and/or a median diameter D50, determined from a distribution obtained by laser diffraction, comprised between 60 nm and 700 nm, particularly between 70 nm and 200 nm; and/or a dispersion index, determined from a distribution obtained by laser diffraction, of at most 0.6, particularly of at most 0.4, more particularly of at most 0.3.

According to one sub-embodiment, the cerium based particles used in step (a) are lanthanum doped cerium oxide particles. Such particles may exhibit:

a hydrodynamic mean diameter Dh, determined from a distribution obtained by DLS, comprised between 100 nm and 1000 nm, more particularly between 100 nm and 500 nm, even more particularly between 100 nm and 250 nm, even more particularly between 150 nm and 250 nm. and/or a median diameter D50, determined from a distribution obtained by laser diffraction, comprised between 100 nm and 700 nm, particularly between 100 nm and 200 nm; and/or a dispersion index, determined from a distribution obtained by laser diffraction, of at most 0.6, particularly of at most 0.4, more particularly of at most 0.3.

Such particles can especially be manufactured as described in WO 2018/229005.

The temperature of the dispersion of cerium based particles provided in step (a) may be set up, prior to step (b), at a value comprised between 0° C. and 80° C., preferably between 10° C. and 60° C., more preferably between 15° C. and 45° C., in particular between 20° C. and 40° C., more particularly between 25° C. and 35° C., even more particularly between 30° C. and 35° C. It is preferable to set up the required temperature while stirring the dispersion. Stirring may be started before adjusting the temperature.

As well, the pH of the dispersion of cerium based particles provided in step (a) may be set up at a value, prior to step (b), lower or equal to 11, preferably comprised between 3 and 11, preferably between 4 and 11, preferably between 8 and 11, more preferably between 8 and 10, particularly between 8 and 9, more particularly about 9. A pH adjuster may be used in that respect. Depending on the initial pH of the dispersion, the pH adjuster can be an acid or a base. As suitable acid, mention can be made of nitric acid, hydrochloric acid, sulfonic acid, carbonic acid, picolinic acid, propionic acid, and mixtures thereof, being preferably nitric acid. As suitable base, mention can be made of alkali metal and alkaline earth metal hydroxides and aqueous ammonia. Secondary, tertiary or quaternary amines can also be used. Aqueous ammonia is preferred. According to a preferred embodiment, the pH adjuster is a base, preferably aqueous ammonia.

Preparation of the Core Particles Provided in Step (a)

According to one embodiment, the cerium based particles used in step (a) are prepared by a method based on the precipitation of a cerium (III) salt and a cerium (IV) salt. This method comprises the following steps:

(a') contacting under an inert atmosphere, an aqueous solution of a base and an aqueous solution comprising $NO_3^-$, Ce(III), Ce(IV) and optionally at least one metal (M);

(b') subjecting the mixture obtained in step (a') to a thermal treatment under an inert atmosphere;

(c') the mixture obtained at the end of step (b') may optionally be acidified;

(d') the solid material obtained at the end of step (b') or step (c') may optionally be washed with water;

(e') the solid material obtained at the end of step (d') may optionally be subjected to a mechanical treatment to deagglomerate the particles.

The Ce(IV)/total Ce molar ratio in step (a') may be comprised between 1/500 000 and 1/4000. It may generally be between 1/90 000 and 1/100 000.

If at least one metal (M) is provided in step (a'), its appropriate amount is determined in order to get a molar ratio M/M+Ce in the metal (M) doped cerium oxide particles produced according to this embodiment comprised between 0.01 and 0.15, more particularly between 0.01 and 0.12.

The metal (M), if present in the aqueous solution of step (a'), is provided by a salt which may be a metal (M) nitrate, chloride, sulfate, phosphate, acetate or carbonate, and also mixtures of these salts, such as mixed nitrates/chlorides. It is preferably a metal (M) nitrate. The metal (M) is such as defined in the above description in connection with step (a) of the process of the invention.

The amount of nitrate ions in the aqueous solution used in step (a'), expressed by the $NO_3^-$/Ce(III) molar ratio is generally between 1/3 and 5/1.

The acidity of the aqueous solution used in step (a') is chosen so as to have the cerium (III) entirely present in solution. It is preferably comprised between 0.8 N and 12.0 N.

Cerium (IV) may be provided in step (a') by a salt which may be cerium (IV) nitrate, sulfate, cerium ammonium nitrate, cerium ammonium sulfate. It is preferably cerium (IV) nitrate. A ceric nitrate solution can advantageously be obtained according to the method of electrolytic oxidation of a cerous nitrate solution as disclosed in FR 2570087. A solution of ceric nitrate obtained according to the teaching of FR 2570087 may exhibit an acidity of around 0.6 N.

Cerium (III) may be provided in step (a') by a salt which may be cerium (III) nitrate, chloride, sulfate, phosphate, acetate or carbonate, and also mixtures of these salts, such as mixed nitrates/chlorides. It is preferably cerium (III) nitrate.

The amount of free oxygen in the starting solution in step (a') should be carefully controlled and minimized. To this end, the starting solution may be degassed by bubbling with an inert gas. The term "inert gas" or "inert atmosphere" is intended to mean an atmosphere or a gas free of oxygen, it being possible for the gas to be, for example, nitrogen or argon.

As base used in step (a'), products of the hydroxide type can in particular be used. Mention may be made of alkali metal or alkaline earth metal hydroxides and aqueous ammonia. Secondary, tertiary or quaternary amines can also be used. The aqueous solution of the base can also be degassed beforehand by bubbling with an inert gas. The amount of the base used in step (a'), expressed by the molar ratio base/(Ce+optional M), is preferably comprised between 8.0 and 30.0. This ratio may preferably be higher than 9.0.

Step (a') may be generally carried out at a temperature comprised between 5° C. and 50° C. This temperature may be 20-25° C.

Step (b') is a thermal treatment of the reaction medium obtained at the end of the preceding step. It consists in (i) an heating substep and (ii) in an aging substep. The heating substep (i) consists in heating the medium at a temperature which is generally comprised between 75° C. and 95° C., more particularly between 80° C. and 90° C., even more particularly between 85° C. and 90° C.

The aging substep (ii) consists in maintaining the medium at a temperature comprised between 75° C. and 95° C., more particularly between 80° C. and 90° C., even more particularly between 85° C. and 90° C. The duration of the aging substep (ii) is between 2 hours to 20 hours. The higher the temperature of the aging step, the lower the duration of the aging substep. For instance, when the temperature of the aging substep is between 85° C. and 90° C., eg. 88° C., the duration of the aging substep may be between 2 hours and 15 hours, more particularly between 4 hours and 15 hours. When the temperature of the aging substep is between 75° C. and 85° C., eg. 80° C., the duration of the aging substep may be between 15 hours and 30 hours.

During step (b'), the oxidation of Ce (III) to Ce (IV) occurs. This step may also be carried out under an inert atmosphere. The description with respect to the atmosphere for step (a') applies herein.

In step (c'), the mixture obtained at the end of step (b') may optionally be acidified. This step (c') may be performed by using nitric acid. The reaction mixture may be acidified by $HNO_3$ to a pH lower than 3.0, more particularly comprised between 1.5 and 2.5.

In step (d'), the solid material obtained at the end of step (b') or step (c') may be washed with water, preferably deionized water. This operation makes it possible to decrease the amount of residual anions, especially nitrates, in the dispersion and to obtain the targeted conductivity. This step may be carried out by filtering the solid from the mixture and redispersing the solid in water. Filtration and redispersion may be performed several times if necessary.

In step (e'), the solid material obtained at the end of step (d) may be subjected to a mechanical treatment to deagglomerate the particles. The step may be carried out by a double jet treatment or ultrasonic deagglomeration. This step usually leads to a sharp particle size distribution and to a reduction of the number of large agglomerated particles. According to an embodiment, the cerium based particles are subjected to the mechanical treatment of deagglomeration. According to another embodiment, the cerium based particles are not subjected to the mechanical treatment of deagglomeration.

After step (e'), the solid material may be dried to obtain the cerium based particles to be provided in step (a) in the powder form. After step (e'), water may also be added to obtain directly the aqueous dispersion of cerium based particles to be provided in step (a).

Aqueous Solution(s) Provided in Step (a)

The aqueous solution comprising a cerium (III) salt and the optional aqueous solution comprising at least one metal (M') salt purpose is to form the nanoparticles of the shell of the cerium based core-shell particles to be produced.

Cerium (III) salt may be cerium (III) nitrate, chloride, sulfate, phosphate or carbonate, and also mixtures of these salts, such as mixed nitrates/chlorides. It is preferably cerium (III) nitrate.

The nitrate ions can be provided in any of steps (a) or (b). The amount of nitrate ions, expressed by the $NO_3^-/Ce(III)$ molar ratio, is generally between 1/3 and 5/1.

The acidity of the aqueous solution comprising the cerium (III) salt provided in step (a) is chosen so as to have the cerium (III) entirely present in solution. It is preferably comprised between 0.8 N and 12.0 N. A suitable acid may be used in that respect, such as nitric acid, hydrochloric acid, sulfonic acid, carbonic acid, picolinic acid, propionic acid and mixtures thereof, being preferably nitric acid.

It is advantageous to use salts and ingredients of high purity. The purity of the salts may be at least 99.5% wt, more particularly of at least 99.9% wt.

According to one embodiment wherein it is desired to get a shell of metal (M') doped cerium oxide, an aqueous solution comprising at least one metal (M') salt is also provided in step (a). The metal (M') salt may be a metal (M') nitrate, chloride, sulfate, phosphate, acetate or carbonate, and also mixtures of these salts, such as mixed nitrates/chlorides. It is preferably a metal (M') nitrate. When it is desired to produce cerium based core-shell particles wherein both of the core and the shell are doped, the metal (M') may be the same or different from the metal (M) described above. The metal (M') may be more particularly chosen from the group consisting of alkali metal elements, alkaline earth metal elements, rare earth elements, actinide elements, transition metal elements and post transition metal elements, from the Periodic Table. The definitions of these groups of elements given in connection with the metal (M) apply equally. Preferably, said at least one metal (M') is chosen from the group consisting of transition metal elements, such as Zr; post transition metal elements, such as Al; rare earth elements, such as La, Pr, Nd and Y; and alkaline earth metal elements, such as Sr. More preferably, said at least one metal (M') is chosen from the group consisting of lanthanum, praseodymium, neodymium and zirconium. Still more preferably, said at least one metal (M') is chosen from the group consisting of lanthanum, praseodymium and neodymium. Even more preferably, said at least one metal (M') is lanthanum.

According to this embodiment, the amount of salt of metal (M') may be determined in order to get a molar ratio M'/M'+Ce in the shell of the core-shell particles comprised between 0.01 and 0.15, more particularly between 0.01 and 0.12.

Step (b)

Step (b) consists in reacting, under oxidizing atmosphere, the aqueous dispersion comprising particles of cerium oxide optionally doped with at least one metal (M), the aqueous solution comprising a cerium (III) salt and optionally the aqueous solution comprising at least one metal (M') salt provided in step (a), while maintaining the temperature comprised between 0° C. and 80° C. and the pH lower or equal to 11, to produce the dispersion of cerium based core-shell particles.

The aqueous dispersion and the aqueous solution(s) can be contacted simultaneously or sequentially, in any order or any combination. When both provided, the aqueous solution comprising a cerium (III) salt and the aqueous solution comprising at least one metal (M') salt may especially be contacted with each other prior to step (b), so as to form an aqueous solution comprising a cerium (III) salt and at least one metal (M') salt. The resulting solution may then be contacted with the dispersion comprising the particles of cerium oxide optionally doped with at least one metal (M) in step (b).

"Oxidizing atmosphere" means an atmosphere comprising free oxygen. It can be air or any oxygen-containing atmosphere, such as a molecular oxygen enriched atmosphere for example.

The contacting step (b) may comprise a contacting substep (i) followed by an aging substep (ii). During the contacting substep (i), the dispersion and the solution(s) are brought into contact with each other while maintaining the required temperature and pH. During the aging substep (ii), the medium resulting from the contacting substep (i) is maintained at the required temperature and pH for a certain period of time.

The contacting substep (i) may be performed by introducing, preferably progressively, the solution(s) into the dispersion provided in step (a).

The molar ratio cerium oxide/cerium (III) before starting step (c) may be comprised between 1/1 and 100/1, in particular between 3/1 and 30/1, more particularly between 5/1 and 15/1.

The duration of the aging substep (ii) may be from 2 hours to 24 hours, particularly from 2 hours to 10 hours, more particularly from 2 hours to 5 hours.

The temperature of the medium is maintained for the duration of step (b) at a value comprised between 0° C. and 80° C., preferably between 10° C. and 60° C., more preferably between 15° C. and 45° C., in particular between 20° C. and 40° C., more particularly between 25° C. and 35° C., even more particularly between 30° C. and 35° C. Noteworthy enough, the process can be operated at a low temperature. Energy savings can thus be achieved.

The pH of the medium is maintained for the duration of step (b) at a value lower or equal to 11, preferably between 3 and 11, preferably between 4 and 11, preferably between 8 and 11, more preferably between 8 and 10, particularly between 8 and 9, more particularly about 8. Depending on the initial pH of the medium, the pH adjuster can be an acid or a base. As suitable acid, mention can be made of nitric acid, hydrochloric acid, sulfonic acid, carbonic acid, picolinic acid, propionic acid, and mixtures thereof, being preferably nitric acid. As suitable base, mention can be made of alkali metal and alkaline earth metal hydroxides and aqueous ammonia. Secondary, tertiary or quaternary amines can also be used. Aqueous ammonia is preferred. According to a preferred embodiment, the pH adjuster is a base, preferably aqueous ammonia.

Step (b) may be advantageously carried out at atmospheric pressure (i.e. at about 1,013.25 mbar).

Stirring of the medium may be performed for the duration of step (b).

According to one embodiment, no salt of Ce (IV) is introduced in step (a) or (b). In conventional cerium precipitation based methods, Cerium (IV) ions are used as crystal seeds to promote the nucleation in the solution. In the process of the invention however, cerium based particles provided from the dispersion of step (a) and intended to be the core particles already play this role. The presence of an additional Ce (IV) salt could lead to the formation of small particles of cerium oxide independent of the core-shell particles and consequently increase the dispersion index of the dispersions of particles obtained, which is not desired for the targeted polishing application.

Optional Step (c)

In step (c), the mixture obtained at the end of step (b) or step (d) detailed after may optionally be acidified. This step (c) may be performed by using a suitable acid such as nitric acid, picolinic acid, propionic acid, hydrochloric acid, sulfonic acid, carbonic acid, and mixtures thereof, preferably nitric acid. The reaction mixture may be acidified to a pH lower than 3.0, more particularly comprised between 1.5 and 2.5.

Optional Step (d)

In step (d), the solid material obtained at the end of step (b) or step (c) may be washed with water, preferably deionized water. When both performed, steps (c) and (d) may be performed in any order. This operation makes it possible to decrease the amount of residual anions especially nitrates in the dispersion and to obtain the targeted conductivity. This step may be carried out by filtering the solid from the medium and redispersing the solid in water. Filtration and redispersion may be performed several times if necessary.

Optional Step (e)

In step (e), the solid material obtained at the end of step (b), (c) or (d) may be subjected to a mechanical treatment to deagglomerate the core-shell particles. The step may be carried out by a double jet treatment or ultrasonic deagglomeration. This step usually leads to a sharp particle size distribution and to a reduction of the number of large agglomerated particles. According to an embodiment, the cerium based core-shell particles are subjected to the mechanical treatment of deagglomeration. According to another embodiment, the cerium based core-shell particles are not subjected to the mechanical treatment of deagglomeration.

After step (e), the solid material may be dried in a step (f) to obtain the cerium based core-shell particles of the invention in the powder form. After step (e), water may also be added to obtain an aqueous dispersion of cerium based core-shell particles according to the invention. Other liquids than water may be used to prepare dispersions in accordance with the invention, such as a water/water-miscible solvent mixture or an organic solvent. Such dispersions may be prepared from the aqueous dispersions obtained by the process of the invention by methods known per se. The pH of the dispersion may also be adjusted at a value typically comprised between 4 and 6.

According to one embodiment, cerium based core-shell particles having a core of cerium oxide and a shell consisting of nanoparticles of La doped cerium oxide are produced. To that end, an aqueous dispersion of particles of cerium oxide, an aqueous solution comprising a cerium (III) salt being preferably cerium (III) nitrate and an aqueous solution comprising a lanthanum salt being preferably lanthanum nitrate are provided in step (a), in order to implement the above described process.

According to another embodiment, cerium oxide core-shell particles having a core of cerium oxide and a shell consisting of nanoparticles of cerium oxide are produced. To that end, an aqueous dispersion of particles of cerium oxide and an aqueous solution comprising a cerium (III) salt being preferably cerium (III) nitrate are provided in step (a), in order to implement the above described process.

Particles

The invention relates to the cerium based core-shell particles obtainable or obtained by the process described above.

The invention especially relates to cerium based core-shell particles wherein each cerium based core-shell particle has a core particle made of cerium oxide optionally doped with at least one metal (M) and a shell consisting of a plurality of nanoparticles of cerium oxide optionally doped with at least one metal (M'), said nanoparticles being formed on the surface of the core particle, wherein the ratio of the average size of the core-shell particles measured by TEM to the average size of the core-shell particles measured by BET is of at least 1.5.

Such cerium based core-shell particles may additionally exhibit:
- an average core-shell particles size measured by TEM of at most 200 nm, in particular at most 190 nm; it may also be of at most 180 nm, in particular at most 150 nm, at most 140 nm, at most 130 nm, even at most 120 nm. The cerium oxide particles may exhibit an average particles size measured by TEM of at least 30 nm, in particular at least 40 nm, more particularly at least 50 nm. The standard deviation of the value of said average particles size may be of at most 30%, particularly of at most 25%, particularly of at most 20%, more particularly of at most 15%; and/or
- an average core-shell particles size calculated from BET surface measurement of at most 120 nm, particularly of at most 100 nm, at most 85 nm. The cerium oxide particles may exhibit an average particles size calculated from BET surface measurement of at least 15 nm, in particular of at least 19 nm, in particular of at least 20 nm, in particular of at least 30 nm; and/or
- a ratio of the average size of the core shell particles measured by TEM to the average size of the core shell particles measured by BET in particular of at least 1.7, of at least 1.9, more particularly of at least 2.0; and/or
- a hydrodynamic mean diameter Dh, determine by DLS, comprised between 50 nm and 300 nm, in particular between 70 nm and 280 nm, in particular between 80 nm and 250 nm, in particular between 90 nm and 230 nm.
- a median diameter D50, determined from a distribution obtained by laser diffraction, comprised between 30 nm and 180 nm, particularly between 60 nm and 160 nm, more particularly between 80 nm and 150 nm, even more particularly between 90 nm and 145 nm; and/or
- a median diameter D10, determined from a distribution obtained by laser diffraction, comprised between 10 nm and 160 nm, particularly between 40 nm and 130 nm, more particularly between 60 nm and 120 nm, even more particularly between 70 nm and 110 nm; and/or
- a median diameter D90, determined from a distribution obtained by laser diffraction, comprised between 45 nm and 250 nm, particularly between 90 nm and 220 nm, more particularly between 100 nm and 210 nm, even more particularly between 110 nm and 200 nm; and/or
- a dispersion index, determined from a distribution obtained by laser diffraction, of at most 0.5, particularly of at most 0.4, at most 0.3; and/or
- a ratio of the average size measured by TEM of the nanoparticles from the shell to the average size measured by TEM of the core particles of at most 1/2, in particular at most 1/3, in particular at most 1/4; and/or
- a specific surface area, determined by BET, comprised between 8 and 60 m$^2$/g, in particular comprised between 8 and 45 m$^2$/g, in particular comprised between 8 and 30 m$^2$/g, particularly between 10 and 28 m$^2$/g, particularly between 14 and 25 m$^2$/g, more particularly between 15 and 22 m$^2$/g; and/or
- an average crystallite size comprised between 60 and 120 nm, in particular between 60 and 80 nm. It is calculated from the FWHM of (111) face by applying the Scherrer model with a Scherrer constant equal to 0.94.

The minimal values of D10, D50, D90, may each be selected in the examples of the present patent application.

The maximal values of D10, D50, D90 may each be selected in the examples of the present patent application.

The metals (M) and/or (M') optionally present in the core-shell particles of the invention may be chosen among the metals described above in connection with the production process.

When the core particle is doped by at least on metal (M), the molar ratio M/M+Ce in the core particles may be comprised between 0.01 and 0.15, more particularly between 0.01 and 0.13, in particular between 0.01 and 0.12.

When the shell nanoparticles are doped by at least on metal (M'), the molar ratio M'/M'+Ce in the shell particles may be comprised between 0.01 and 0.15, more particularly between 0.01 and 0.13, in particular between 0.01 and 0.12.

According to specific embodiments of the invention:
- both of the core and shell particles are made of cerium oxide; or
- the core particles are made of cerium oxide and the shell particles are made of lanthanum doped cerium oxide; or
- the core particles are made of lanthanum doped cerium oxide and the shell particles are made of cerium oxide; or
- the core particles are made of lanthanum doped cerium oxide and the shell particles are made of lanthanum doped cerium oxide.

Dispersion

The invention also relates to a dispersion of the cerium based core-shell particles of the invention in a liquid medium.

The zeta potential of the cerium based core-shell particles comprised in the dispersion of the invention is advantageously positive. It can be measured at a pH value of the dispersion comprised between 4 and 9.5. The zeta potential may be measured with a zetameter DT300 from Quantachrome on dispersions at 1% in weight.

The dispersions of the invention may advantageously exhibit a conductivity lower than 600 µS/cm, lower than 300 µS/cm, more particularly lower than 150 µS/cm, even more particularly lower than 100 µS/cm.

The liquid medium may be water or a mixture of water and a water-miscible organic liquid. The water-miscible organic liquid should not make the particles precipitate or agglomerate. The water-miscible organic liquid may for instance be an alcohol like isopropyl alcohol, ethanol, 1-propanol, methanol, 1-hexanol; a ketone like acetone, diacetone alcohol, methyl ethyl ketone; an ester like ethyl formate, propyl formate, ethyl acetate, methyl acetate, methyl lactate, butyl lactate, ethyl lactate. The proportion water/organic liquid may be between 80/20 to 99/1 (wt/wt).

The proportion of cerium based core-shell particles in the dispersion may be comprised between 0.5 wt % and 40.0 wt %, this proportion being expressed as the weight of the cerium based core-shell particles over the total weight of the dispersion. This proportion may be comprised between 10.0 wt % and 35.0 wt %.

Uses of the Cerium Based Core-Shell Particles or of the Dispersion

The cerium based core-shell particles of the invention or the dispersion of the invention may be used to prepare a polishing composition, more particularly a CMP composition. They are used as a component of a polishing composition, more particularly a CMP composition.

A CMP composition (or chemical-mechanical polishing composition) is a polishing composition used for the selective removal of material from the surface of a substrate. It is used in the field of integrated circuits and other electronic devices. Indeed, in the fabrication of integrated circuits and other electronic devices, multiple layers of conducting, semiconducting, and dielectric materials are deposited onto or removed from the surface of a substrate. As layers of materials are sequentially deposited onto and removed from the substrate, the uppermost surface of the substrate may become non-planar and require planarization. Planarizing a surface (or "polishing") the surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization also is useful in forming features on a substrate by removing excess deposited material used to fill the features and to provide an even surface for subsequent levels of metallization and processing.

The substrate that can be polished with a polishing composition or a CMP composition may be for instance a silicon dioxide-type substrates, glass, a semiconductor or a wafer.

The polishing composition or the CMP composition usually contains different ingredients other than the cerium based core-shell particles. The polishing composition may comprise one or more of the following ingredients:
- abrasive particles other than the cerium-based particles (herein referred to as "additional abrasive particles"); and/or
- a pH regulator; and/or
- a surfactant; and/or
- a rheological control agent, including viscosity enhancing agents and coagulants; and/or
- an additive selected from an anionic copolymer of a carboxylic acid monomer, a sulfonated monomer, or a phosphonated monomer, and an acrylate, a polyvinylpyrrolidone, or a polyvinylalcohol (e.g., a copolymer of 2-hydroxyethylmethacrylic acid and methacrylic acid); a nonionic polymer, wherein the nonionic polymer is polyvinylpyrrolidone or polyethylene glycol; a silane, wherein the silane is an amino silane, an ureido silane, or a glycidyl silane; an N-oxide of a functionalized pyridine (e.g. picolinic acid N-oxide); a starch; a cyclodextrin (e.g., alpha-cyclodextrin or beta-cyclodextrin), and combinations thereof.

The pH of the polishing composition is generally comprised between 1 and 6. Typically, the polishing composition has a pH of 3.0 or greater. Also, the pH of the polishing composition typically is 6.0 or less.

The cerium based core-shell particles of the invention may be used in the polishing compositions disclosed in the following documents: WO 2013/067696; WO 2016/140968; WO 2016/141259; WO 2016/141260; WO 2016/047725; WO 2016/006553.

The invention also relates to a method of removing a portion of a substrate, the method comprising polishing the substrate with a polishing composition prepared from a dispersion comprising the cerium based core-shell particles according to the invention.

The invention finally relates to a semiconductor comprising a substrate polished by this method.

Should the disclosure of any patents, patent applications, and publications which are incorporated herein by reference conflict with the description of the present application to the extent that it may render a term unclear, the present description shall take precedence.

EXAMPLES

The invention will now be further described in the following examples without intending to limit it.

Example 1: Particles Core $CeO_2$ (60 nm) Shell $CeO_2$—Concentration 5 wt %

A dispersion of cerium oxide particles in water at 5% in weight is prepared by adding 233 g of cerium oxide aqueous dispersion Zenus® commercially available from Solvay (average primary particle size=60 nm calculated from BET measurements) at 30% in weight in 1167 g of deionized water. A dilute ammonia solution is prepared by adding 42 g of 28% aqueous ammonia in 208 g of deionized water. A solution of trivalent cerium nitrate solution is prepared by adding 25.5 g of trivalent cerium nitrate solution at 2.87 M in 87.5 g of deionized water.

The cerium oxide aqueous dispersion at 5% in weight is introduced in a 2 L jacketed reactor semi closed and then stirred (agitator with four blades inclined at 300 rpm). The reaction mixture is then warmed up to 35° C. under the same stirring. The initial pH of the dispersion is increased up to 9 by addition of ammonia solution at 2.5 M. Then the trivalent cerium nitrate solution is added at 5 mL per minutes by a peristaltic pump. During this step, the pH is maintained at 8 by the controlled addition of ammonia solution at 2.5 M. After the end of the addition, the reaction mixture is maintained at the same temperature and same stirring for 4 h. The pH is maintained over this time by the controlled addition of ammonia solution at 2.5 M. The reaction is then stopped and the dispersion is washed several times by centrifugation, removal of the centrifugation supernatant and redispersion of the cake in deionized water. Finally, the dispersion is adjusted at 10-15% by weight with a pH around 5 and an ionic conductivity below 0.1 mS·cm$^{-1}$. The dispersion is deagglomerated by successive passes through a dual-impact jet homogenizer.

The dispersion obtained is observed by TEM. It is noted that the particles are monodispersed and size centered around 110 nm. The diameter is determined after the count of 150 particles on TEM images, whereby an average particle size of 109 nm with a standard deviation of 16 nm (15% of the average size) is obtained. It is observed that the cerium salt precipitated on the Zenus® cerium oxide particles, leading to a shell formation with a rough surface (FIG. 1).

Figure 3:
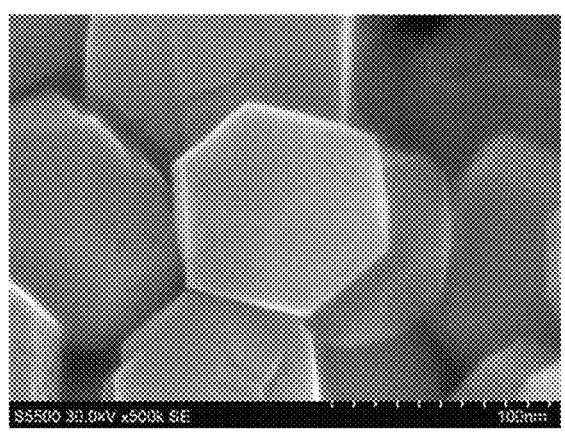
FIG. 3 is a SEM picture of a dispersion of the cerium oxide particles intended to be used as core particles in the process illustrated in examples 1, 2 and 4.
Figure 4:
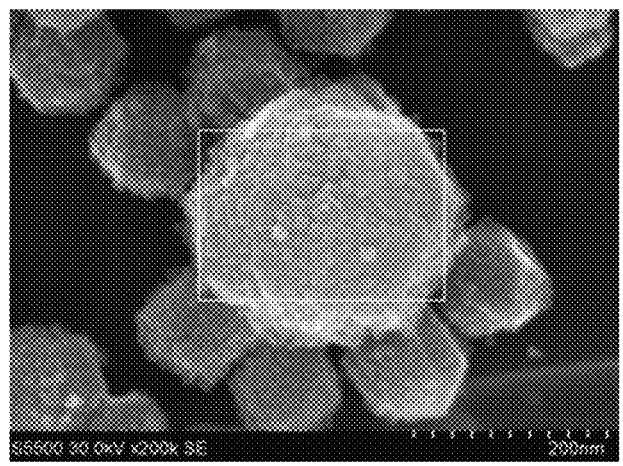
FIG. 4 is a SEM picture of a dispersion of the core-shell particles of the invention obtained by the process illustrated in example 1, having a cerium oxide core and a cerium oxide shell.

Part of the dispersion is dried in an oven at 200° C., thereby obtaining a powder for the XRD analysis and the BET surface measurement. The diffractogram of this powder shows signature of crystallized $CeO_2$ (record ASTM 34-394). The average crystallite size of the core-shell particles is 69 nm. The BET specific surface area determined by nitrogen adsorption is 13.0 m$^2$/g for the starting particles and 18 m$^2$/g for the core-shell particles, giving an average primary particle size of 64 nm and 46 nm respectively. The secondary particle size is measured at relative refractive index 1.7 of $CeO_2$ in the water by laser particle sizer (Horiba LA-910) for the starting particles and the final core-shell particles. The D10, D50 and D90 are respectively 81, 99 and 123 nm for the starting particles. The D10, D50 and D90 are respectively 89, 107 and 129 nm for the core-shell particles, which gives a dispersion index σ/m of 0.19. The secondary particle size is also measured at relative refractive index 1.7 of $CeO_2$ in the water by dynamic light scattering (DLS). The hydrodynamic diameter is 169 nm for the core-shell particles. The morphology of the particles before and after the formation of the shell is observed by SEM (FIGS. 3 and 4 respectively).

Example 2: Particles Core $CeO_2$ (60 nm) Shell $CeO_2$:La—Concentration 5 wt %

Example 1 is repeated with the difference that, instead of the trivalent cerium nitrate solution, a solution of trivalent cerium nitrate and lanthanum nitrate is used. It is prepared by adding 22.95 g of trivalent cerium nitrate solution at 2.87 M and 2.55 g of trivalent lanthanum nitrate solution at 2.87 M in 87.5 g of deionized water (molar ratio La/La+Ce of 0.10).

The dispersion obtained is observed by TEM. It is noted that the particles are monodispersed and size centered around 110 nm. The diameter is determined after the count of 150 particles on TEM images, whereby an average particle size of 109 nm with a standard deviation of 17 nm (16% of the average size) is obtained. It is noted that the cerium and lanthanum salts precipitated on the Zenus® cerium oxide particles, leading to a shell formation with a rough surface.

Figure 5:
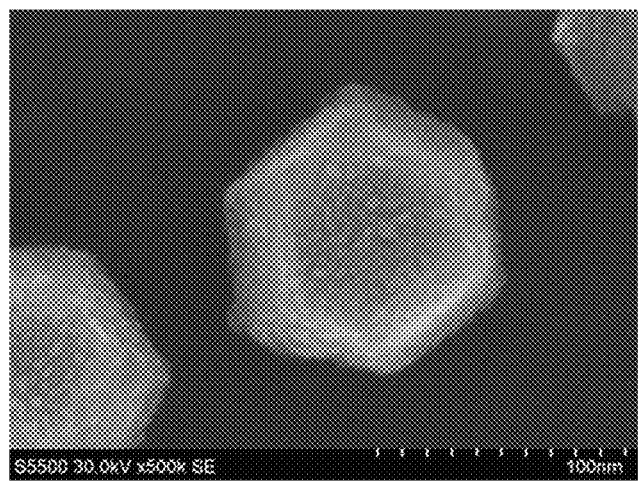
FIG. 5 is a SEM picture of a dispersion of the core-shell particles of the invention obtained by the process illustrated in example 2, having a cerium oxide core and a cerium oxide doped with lanthanum shell.

Part of the dispersion is dried in an oven at 200° C., thereby obtaining a powder for the XRD analysis and the BET surface measurement. The diffractogram of this powder shows signature of crystallized $CeO_2$ (record ASTM 34-394). The average crystallite size of the core-shell particles is 68 nm. The BET specific surface area determined by nitrogen adsorption is 13.0 $m^2/g$ for the starting particles and 16 $m^2/g$ for the core-shell particles, giving an average primary particle size of 64 nm and 52 nm respectively. The secondary particle size is measured at relative refractive index 1.7 of $CeO_2$ in the water by laser particle sizer (Horiba LA-910) for the starting particles and the core-shell particles. The D10, D50 and D90 are respectively of 81 nm, 99 nm and 123 nm for the starting particles. The D10, D50 and D90 are respectively of 82 nm, 99 nm and 122 nm for the core-shell particles, which gives a dispersion index σ/m of 0.20. The secondary particle size is also measured at relative refractive index 1.7 of $CeO_2$ in the water by dynamic light scattering (DLS). The hydrodynamic diameter is 150 nm for the core-shell particles. The morphology of the particles before and after the formation of the shell is observed by SEM (FIGS. 3 and 5 respectively).

Example 3: Particles Core $CeO_2$ (90 nm) Shell $CeO_2$—Concentration 5 wt %

A dispersion of cerium oxide particles in water at 5% in weight is prepared by adding 180 g of cerium oxide aqueous dispersion Zenus® commercially available from Solvay (average primary particle size=90 nm calculated from BET measurements) at 24% in weight in 670 g of deionized water. A dilute ammonia solution is prepared by adding 42 g of 28% aqueous ammonia in 208 g of deionized water. A solution of trivalent cerium nitrate solution is prepared by adding 19.1 g of trivalent cerium nitrate solution at 2.87 M in 76.8 g of deionized water.

The cerium oxide aqueous dispersion at 5% in weight is introduced in a 1 L jacketed reactor semi closed and then stirred (agitator with four blades inclined at 300 rpm). The reaction mixture is then warmed up to 35° C. under the same stirring. The initial pH of the dispersion is increased up to 9 by addition of ammonia solution at 2.5 M. Then the trivalent cerium nitrate solution is added at 2.55 mL per minutes by a peristaltic pump. During this step, the pH is maintained at 8 by the controlled addition of ammonia solution at 2.5 M. After the end of the addition, the reaction mixture is maintained at the same temperature and same stirring for 6 h. The pH is maintained over this time by the controlled addition of ammonia solution at 2.5 M. The reaction is then stopped and the dispersion is washed several times by centrifugation, removal of the centrifugation supernatant and redispersion of the cake in deionized water. Finally, the dispersion is adjusted at 10-15% weight with a pH around 5 and an ionic conductivity below 0.1 $mS·cm^{-1}$. The dispersion is deagglomerated by successive passes through a dual-impact jet homogenizer.

The dispersion obtained is observed by TEM. It is noted that the particles are monodispersed and size centered around 110 nm. The diameter is determined after the count of 150 particles on TEM images, whereby an average particle size of 185 nm with a standard deviation of 33 nm (18% of the average size) is obtained. It is noted that the cerium salt precipitated on the Zenus® cerium oxide particles, leading to a shell formation with a rough surface.

Figure 6:
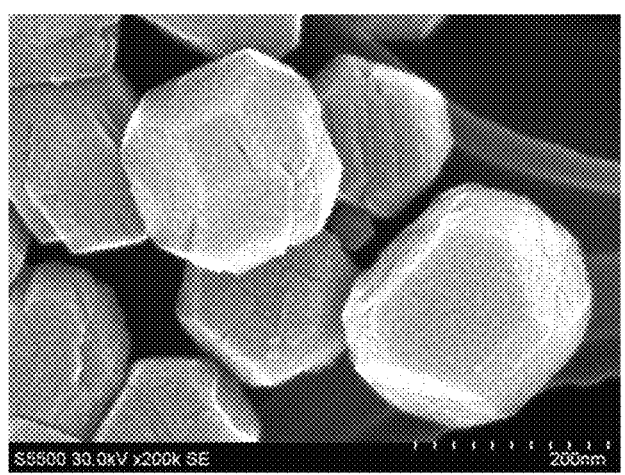
FIG. 6 is a SEM picture of a dispersion of the core-shell particles of the invention obtained by the process illustrated in example 3, having a cerium oxide core and a cerium oxide shell.

Part of the dispersion is dried in an oven at 200° C., thereby obtaining a powder for the XRD analysis and the BET surface measurement. The diffractogram of this powder shows signature of crystallized $CeO_2$ (record ASTM 34-394). The average crystallite size of the core-shell particles is 100 nm. The BET specific surface area determined by nitrogen adsorption is 8.0 $m^2/g$ for the starting particles and 10 $m^2/g$ for the core-shell particles, giving an average primary particle size of 104 nm and 83 nm respectively. The secondary particle size is measured at relative refractive index 1.7 of $CeO_2$ in the water by laser particle sizer (Horiba LA-910) for the starting particles and the core-shell particles. The D10, D50 and D90 are respectively of 106, 140 and 200 nm for the starting particles. The D10, D50 and D90 are respectively of 107, 140 and 199 nm for the core-shell particles, which gives a dispersion index σ/m of 0.33. The secondary particle size is also measured at relative refractive index 1.7 of $CeO_2$ in the water by dynamic light scattering (DLS). The hydrodynamic diameter is 222 nm for the core-shell particles. The morphology of the particles after the formation of the shell is observed by SEM (FIG. 6).

Example 4: Particles Core $CeO_2$ (60 nm) Shell $CeO_2$—Concentration 20 wt %

A dispersion of cerium oxide particles in water at 20% in weight is prepared by adding 805.8 g of cerium oxide aqueous dispersion Zenus® commercially available from Solvay (average primary particle size=60 nm calculated from BET measurements) at 34% in weight in 594.2 g of deionized water. A dilute ammonia solution is prepared by adding 42 g of 28% aqueous ammonia in 208 g of deionized water. A solution of trivalent cerium nitrate solution is prepared by adding 153.4 g of trivalent cerium nitrate solution at 2.87 M in 21.2 g of deionized water.

The cerium oxide aqueous dispersion at 20% in weight is introduced in a 2 L jacketed reactor semi closed and then stirred (agitator with four blades inclined at 400 rpm). The reaction mixture is then warmed up to 35° C. under the same stirring. The initial pH of the dispersion is increased up to 8 by addition of ammonia solution at 2.5 M. Then the trivalent cerium nitrate solution is added at 3.4 mL per minutes by a peristaltic pump. During this step, the pH is maintained at 8 by the controlled addition of ammonia solution at 2.5 M. After the end of the addition, the reaction mixture is maintained at the same temperature and same stirring for 22 h. The pH is maintained over this time by the controlled addition of ammonia solution at 2.5 M. The reaction is then stopped and the dispersion is washed several times by centrifugation, removal of the centrifugation supernatant and redispersion of the cake in deionized water. Finally, the dispersion is adjusted at 10-15% by weight with a pH around 5 and an ionic conductivity below 0.1 mS·cm$^{-1}$. The dispersion is deagglomerated by successive passes through a dual-impact jet homogenizer.

The dispersion obtained is observed by TEM. It is noted that the particles are monodispersed and size centered around 110 nm. The diameter is determined after the count of 150 particles on TEM images, whereby an average particle size of 109 nm with a standard deviation of 16 nm (15% of the average size) is obtained. It is noted that the cerium salt precipitated on the Zenus® cerium oxide particles, leading to a shell formation with a rough surface.

Figure 7:
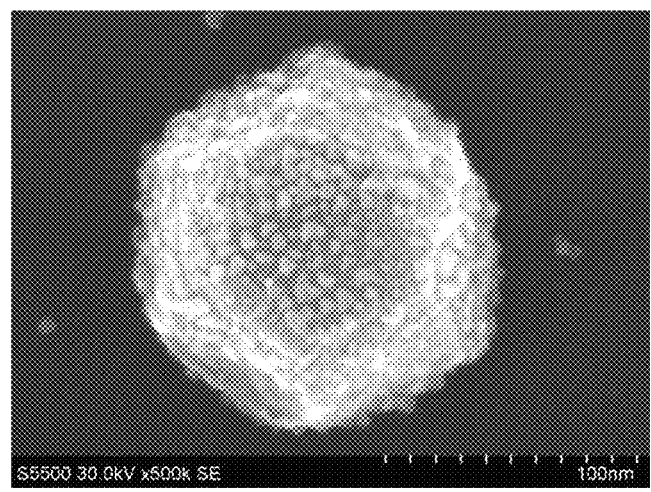
FIG. 7 is a SEM picture of a dispersion of the core-shell particles of the invention obtained by the process illustrated in example 4, having a cerium oxide core and a cerium oxide shell.

Part of the dispersion is dried in an oven at 200° C., thereby obtaining a powder for the XRD analysis and the BET surface measurement. The diffractogram of this powder shows signature of crystallized $CeO_2$ (record ASTM 34-394). The average crystallite size of the core-shell particles is 71 nm. The BET specific surface area determined by nitrogen adsorption is 13 m$^2$/g for the starting particles and 21 m$^2$/g for the core-shell particles, giving an average primary particle size of 64 nm and 40 nm respectively. The secondary particle size is measured at relative refractive index 1.7 of $CeO_2$ in the water by laser particle sizer (Horiba LA-910) for the starting particles and the core-shell particles. The D10, D50 and D90 are respectively of 81, 99 and 123 nm for the starting particles. The D10, D50 and D90 are respectively of 96, 114 and 144 nm for the core-shell particles, which gives a dispersion index σ/m of 0.21. The secondary particle size is also measured at relative refractive index 1.7 of $CeO_2$ in the water by dynamic light scattering (DLS). The hydrodynamic diameter is 159 nm for the core-shell particles. The morphology of the particles before and after the formation of the shell is observed by SEM (FIGS. 3 and 7 respectively).

Example 5: Particles Core $CeO_2$:La (212 nm)—Shell $CeO_2$—Concentration 20 wt %

A dispersion of cerium oxide particles in water at 5% in weight is prepared by adding 940.5 g of $CeO_2$:La particles (average primary particle size=212 nm calculated from TEM images, La/La+Ce molar ratio of 0.025, synthesized according to WO 2018/229005 example 1) at 29.8% in weight in 459.5 g of deionized water. A dilute ammonia solution is prepared by adding 42 g of 28% aqueous ammonia in 208 g of deionized water. A solution of trivalent cerium nitrate solution is prepared by adding 70.5 g of trivalent cerium nitrate solution at 2.87 M in 9.7 g of deionized water. The doped cerium oxide aqueous dispersion at 20% in weight is introduced in a 2 L jacketed reactor semi closed and then stirred (agitator with four blades inclined at 300 rpm). The reaction mixture is then warmed up to 35° C. under the same stirring. The initial pH of the dispersion is increased up to 8 by addition of ammonia solution at 2.5 M. Then the trivalent cerium nitrate solution is added at 5 mL per minutes by a peristaltic pump. During this step, the pH is maintained at 8 by the controlled addition of ammonia solution at 2.5 M.

After the end of the addition, the reaction mixture is maintained at the same temperature and same stirring for 3 h. The pH is maintained over this time by the controlled addition of ammonia solution at 2.5 M. The reaction is then stopped and the dispersion is washed several times by centrifugation, removal of the centrifugation supernatant and redispersion of the cake in deionized water. Finally, the dispersion is adjusted at 10-15% by weight with a pH around 5 and an ionic conductivity below 0.1 mS·cm$^{-1}$. The dispersion is deagglomerated by successive passes through a dual-impact jet homogenizer.

The dispersion obtained is observed by TEM. It is noted that the particles are monodispersed and size centered around 130 nm. The diameter is determined after the count of 150 particles on TEM images, whereby an average particle size of 131 nm with a standard deviation of 29 nm (22.1% of the average size) is obtained. It is noted that the cerium salt precipitated on the lanthanum-doped cerium oxide particles, leading to a shell formation with a rough surface.

Part of the dispersion is dried in an oven at 200° C., thereby obtaining a powder for the BET surface measurement. The BET specific surface area determined by nitrogen adsorption is 11 m$^2$/g for the starting particles and 17 m$^2$/g for the core-shell particles, giving an average primary particle size of 75 nm and 49 nm respectively. The secondary particle size is measured at relative refractive index 1.7 of $CeO_2$ in the water by dynamic light scattering (DLS). The hydrodynamic diameter is 197 nm for the core-shell particles. The morphology of the particles after the formation of the shell, as observed by TEM, can be seen on FIG. 9.

Example 6: Particles Core $CeO_2$ (30 nm)—Shell $CeO_2$—Concentration 20 wt %

A dispersion of cerium oxide particles in water at 20% in weight is prepared by adding 664.5 g of $CeO_2$ particles (average primary particle size=35 nm calculated from TEM images, commercially available from Solvay) at 30.1% in weight in 335.5 g of deionized water. A dilute ammonia solution is prepared by adding 160.9 g of 28% aqueous ammonia in 839.1 g of deionized water. A solution of trivalent cerium nitrate solution is prepared by adding 342.5 g of trivalent cerium nitrate solution at 2.87 M in 8.6 g of deionized water.

The cerium oxide aqueous dispersion at 20% in weight is introduced in a 2 L jacketed reactor semi closed and then stirred (agitator with four blades inclined at 400 rpm). The reaction mixture is then warmed up to 35° C. under the same stirring. The initial pH of the dispersion is increased up to 8 by addition of ammonia solution at 4.5%. Then the trivalent cerium nitrate solution is added at 9.8 g/min by a peristaltic pump. During this step, the pH is maintained at 8 by the controlled addition of a diluted ammonia solution. After the end of the addition, the reaction mixture is maintained at the same temperature and same stirring for 100 min. The pH is maintained over this time by the controlled addition of a diluted ammonia solution. The reaction is then stopped and the dispersion is washed several times by centrifugation, removal of the centrifugation supernatant and redispersion of the cake in deionized water. Finally, the dispersion is adjusted at 10% by weight with a pH around 5 and an ionic conductivity below 0.1 mS·cm$^{-1}$. The dispersion is deagglomerated by successive passes through a dual-impact jet homogenizer.

Figure 10:
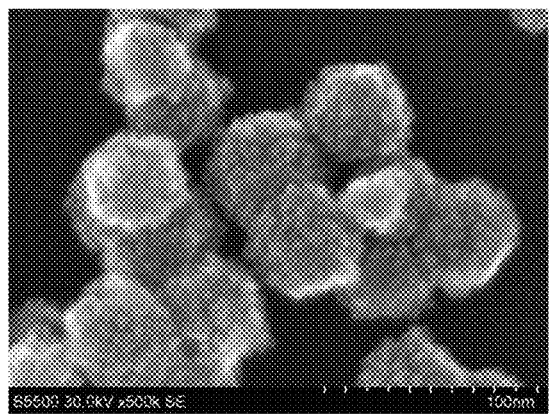
FIG. 10 is a SEM picture of a dispersion of the core-shell particles of the invention obtained by the process illustrated in example 6, having a cerium oxide core and a cerium oxide shell.

The dispersion obtained is observed by SEM. It is noted that the particles are monodispersed and size centered around 40 nm. The diameter is determined after the count of 150 particles on TEM images, whereby an average particle size of 43 nm with a standard deviation of 9 nm (20.9% of the average size) is obtained. It is observed that the cerium salt precipitated on the cerium oxide particles, leading to a shell formation with a rough surface (FIG. 10).

Part of the dispersion is dried in an oven at 200° C., thereby obtaining a powder for the BET surface measurement. The BET specific surface area determined by nitrogen adsorption is 28 m$^2$/g for the starting particles and 40 m$^2$/g for the core-shell particles, giving an average primary particle size of 30 nm and 20 nm respectively. The secondary particle size is measured at relative refractive index 1.7 of CeO$_2$ in the water by laser particle sizer (Horiba LA-910) the final core-shell particles. The D10, D50 and D90 are respectively 67, 81, 95 nm for the core-shell particles, which gives a dispersion index σ/m of 0.17. The secondary particle size is also measured at relative refractive index 1.7 of CeO$_2$ in the water by dynamic light scattering (DLS). The hydrodynamic diameter is 95 nm for the core-shell particles.

Comparative Example 1

The same dispersions and solutions as in example 1 are prepared. The cerium oxide aqueous dispersion at 5% in weight is introduced in a 2 L jacketed reactor semi closed and then stirred (agitator with four blades inclined at 300 rpm). The reaction mixture is then warmed up to 85° C. under the same stirring. The initial pH of the dispersion is increased up to 9.8 by addition of ammonia solution at 2.5 M. Then the trivalent cerium nitrate solution is added at 5 mL per minute by a peristaltic pump. During this step, the pH is maintained at 9.8 by the controlled addition of ammonia solution at 2.5 M. The reaction mixture turns from white to light purple and a flocculation of the particles is observed. After the end of the addition, the reaction mixture is maintained at the same temperature and same stirring for 4 h. The pH is maintained over this time by the controlled addition of ammonia solution at 2.5 M.

Figure 2:
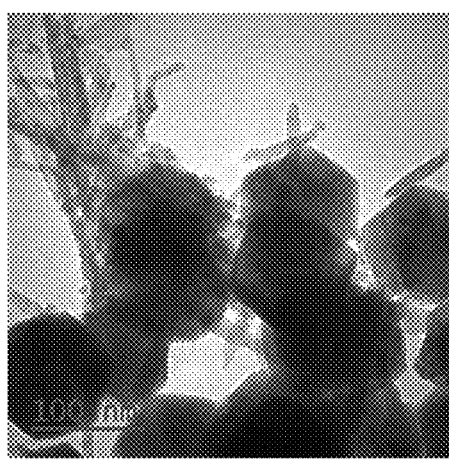
FIG. 2 is a TEM picture of a dispersion of particles of cerium oxide obtained by the process illustrated in counter example 1.

The dispersion is observed by TEM. It is noted that the starting particles are uncovered by small crystallites (no core-shell structure) and that rods of cerium hydroxide are formed (FIG. 2).

Comparative Example 2

The same dispersions and solutions as in example 1 are prepared. The cerium oxide aqueous dispersion at 5% in weight is introduced in a 2 L jacketed reactor semi closed and then stirred (agitator with four blades inclined at 300 rpm). The reaction mixture is then warmed up to 35° C. under the same stirring. The initial pH of the dispersion is increased up to 12 by addition of ammonia solution at 2.5 M. Then the trivalent cerium nitrate solution is added at 5 mL per minute by a peristaltic pump. During this step, the pH is maintained at 12 by the controlled addition of ammonia solution at 2.5 M. After the end of the addition, the reaction mixture is maintained at the same temperature and same stirring for 4 h. The pH is maintained over this time by the controlled addition of ammonia solution at 2.5 M.

The dispersion is observed by TEM. It is noted that the starting particles are agglomerated and uncovered by small crystallites (no core-shell structure).

Comparative Example 3

A dispersion of cerium oxide particles in water at 5% in weight is prepared by adding 41.6 g of cerium oxide aqueous dispersion Zenus® commercially available from Solvay (average primary particles size=60 nm calculated from BET measurements) at 30% in weight in 208.4 g of deionized water. A TN ammonia solution is prepared by adding 28 g of 28% aqueous ammonia in 771 g of deionized water. A solution of trivalent cerium nitrate solution is prepared by adding 0.75 g of trivalent cerium nitrate solution at 2.87 M in 249.25 g of deionized water.

The cerium oxide suspension at 5% in weight and the trivalent cerium nitrate solution are introduced in a 2 L jacketed reactor semi closed and then stirred (agitator with four blades inclined at 300 rpm). The pH of the mixture is adjusted at 11 by the addition of the proper amount of TN ammonia solution and stirred for two hours. The solution is then transferred to a Teflon bottle and placed in a stainless steel autoclave at 170° C. for 12 h.

Figure 8:
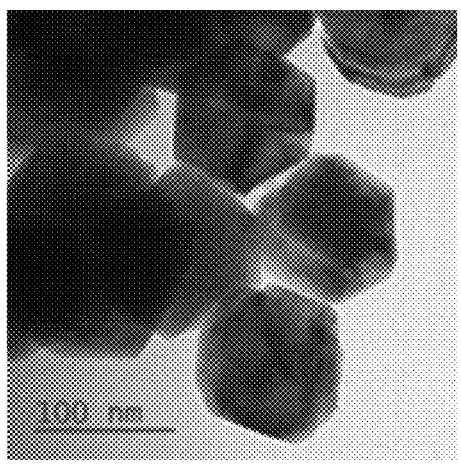
FIG. 8 is a TEM picture of a dispersion of particles of cerium oxide obtained by the process illustrated in counter example 2.

The dispersion is observed by TEM. It is noted that the starting particles are uncovered by small crystallites (no core-shell structure) (FIG. 8).

Evaluation of the Polishing Performance

The polishing machine used is a Struers Tegramin. The surface to be polished is made of amorphous silica. The dispersions of the core-shell particles in water were tested under the following conditions:

pressure applied on the head: 50N;
rotation speed: 150 rpm;
pad: neoprene (MD-Chem)—new pad for every sequence;
flow-rate of the dispersion: 15 mL/min;
dispersion: the amount of core-shell particles is 1 wt %;
the pH of the dispersion is comprised between 6.0 and 6.1, obtained by addition of diluted NH4OH;
polishing time: 10 minutes.

As reference, a cerium oxide aqueous dispersion of Zenus® particles commercially available from Solvay (average CeO$_2$ primary particles size=60 nm calculated from BET measurements) at 1% wt and pH=6.0 is used.

The polishing sequence is the following:
1) The reference dispersion is tested,
2) The sample is tested,
3) The sample is tested a second time.

Between each step of the sequence, the pad is cleaned with deionized water and the dispersion to be tested is introduced on the surface to be polished under the controlled flow-rate.

The loss of weight of the substrate is recorded. The removal rate (RR) expressed in nm/min is then calculated as:

$$RR = \frac{\Delta m * 10^4}{\pi \cdot R^2 \cdot \rho \cdot \Delta t}$$

wherein:
Δm is the weight loss of the substrate;
R radius of the substrate;
ρ density of the substrate;
Δt is the polishing time;

Removal rate efficiency ratio is the ratio of the mean removal rate achieved with the tested dispersion to the removal rate achieved with the reference dispersion for each sequence. As it can be seen from table 1, all the particles of the invention show an improvement of removal rate compared to the reference used (removal rate efficiency ratio above 1). The best results are obtained with doped particles (ex. 2 and 5).

At the end of the polishing test, the substrates and core-shell particles are visually inspected: it is confirmed that the nanoparticles from the shell of the core-shell particles of the invention were sufficiently anchored to remain attached to the core during the polishing.

TABLE 1

| | | Particles Core/shell obtained? | Reaction type | Reaction Temp.reaction temperature (° C.) | pH | SSA ($m^2/g$) | BET size (nm) | TEM size (nm) | size TEM/ size BET | DLS Dh (nm) |
|---|---|---|---|---|---|---|---|---|---|---|
| Comparative examples | 1 | no | precipitation | 85° C. | 9.8 | n/a | n/a | n/a | n/a | n/a |
| | 2 | no | precipitation | 35° C. | 12 | n/a | n/a | n/a | n/a | n/a |
| | 3 | no | hydrothermal | 170° C. | 11 initially | n/a | n/a | n/a | n/a | n/a |
| Examples | 1 | CeO2/CeO2 | precipitation | 35° C. | 8 | 18 | 46 | 109 | 2.4 | 169 |
| | 2 | CeO2/ CeO2:La | precipitation | 35° C. | 8 | 16 | 52 | 109 | 2.1 | 150 |
| | 3 | CeO2/CeO2 | precipitation | 35° C. | 8 | 10 | 83 | 185 | 2.2 | 222 |
| | 4 | CeO2/CeO2 | precipitation | 35°C | 8 | 21 | 40 | 109 | 2.7 | 159 |
| | 5 | CeO2:La/ CeO2 | precipitation | 35°C | 8 | 17 | 49 | 131 | 2.7 | 197 |
| | 6 | CeO2/CeO2 | precipitation | 35°C | 8 | 40 | 20 | 43 | 2.2 | 95 |

Figure 9:
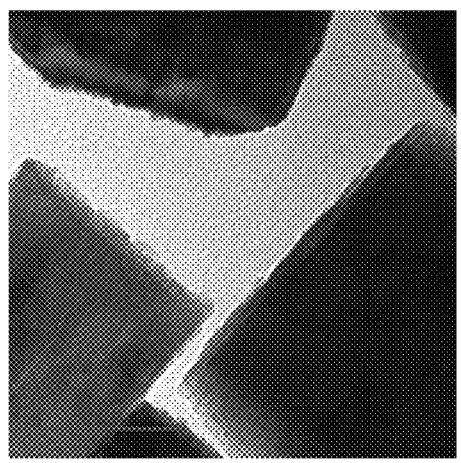
FIG. 9 is a TEM picture of a dispersion of the core-shell particles of the invention obtained by the process illustrated in example 5, having a lanthanum doped cerium oxide core and a cerium oxide shell.

| | | Laser diffraction | | | | Figure | Removal rate |
|---|---|---|---|---|---|---|---|
| | | D10 (nm) | D50 (nm) | D90 (nm) | σ/m | (TEM or SEM) | efficiency ratio |
| Comparative examples | 1 | n/a | n/a | n/a | n/a | FIG. 2 | n/a |
| | 2 | n/a | n/a | n/a | n/a | n/a | n/a |
| | 3 | n/a | n/a | n/a | n/a | FIG. 8 | n/a |
| Examples | 1 | 89 | 107 | 129 | 0.19 | 1, 3 ,4 | 1.1 |
| | 2 | 82 | 99 | 122 | 0.20 | FIG. 3, 5 | 1.3 |
| | 3 | 107 | 140 | 199 | 0.33 | FIG. 6 | 1.1 |
| | 4 | 96 | 114 | 144 | 0.21 | FIG. 3, 7 | 1.1 |
| | 5 | n/a | n/a | n/a | n/a | FIG. 9 | 1.6 |
| | 6 | 67 | 81 | 95 | 0.17 | FIG. 10 | n/a |

The invention claimed is:

1. A process for producing a dispersion of cerium based core-shell particles in a liquid, comprising the following steps:
   (a) providing an aqueous dispersion comprising particles of cerium oxide as core particles, optionally doped with at least one metal (M), wherein the core particles have an average particle size calculated from BET surface measurement, of at least 15 nm; providing an aqueous solution comprising a cerium (III) salt; and optionally providing an aqueous solution comprising at least one metal (M') salt;
   (b) contacting, under oxidizing atmosphere, the aqueous dispersion with the aqueous solution(s) provided in step (a), while maintaining the temperature comprised between 0° C. and 80° C. and the pH lower or equal to 11, to produce the dispersion of cerium based core-shell particles, wherein the shell consists of nanoparticles anchored to the core particles;
   at least one of the steps (a) and (b) being carried out in the presence of nitrate ions.

2. The process according to claim 1, wherein the aqueous dispersion in step (a) comprises at least 3 wt % of particles of cerium oxide optionally doped with at least one metal (M) relative to the total weight of the aqueous dispersion.

3. The process according to claim 1, wherein the particles provided in the aqueous dispersion in step (a) are particles of cerium oxide.

4. The process according to claim 1, wherein the particles provided in the aqueous dispersion in step (a) are particles of cerium oxide doped with at least one metal (M) selected from the group consisting of alkali metal elements, alkaline earth metal elements, rare earth elements, actinide elements, transition metal elements and post transition metal elements, from the Periodic Table.

5. The process according to claim 4, wherein the metal (M) is selected from the group consisting of Zr, Al, La, Pr, Nd, Y, and Sr.

6. The process according to claim 4 wherein the molar ratio M/(M+Ce) in the particles provided in the aqueous dispersion in step (a) is between 0.01 and 0.15.

7. The process according to claim 1, wherein the aqueous solution comprising the at least one metal (M') salt is provided in step (a) and wherein the metal (M') is selected from the group consisting of alkali metal elements, alkaline earth metal elements, rare earth elements, actinide elements, transition metal elements and post transition metal elements, from the Periodic Table.

8. The process according to claim 7, wherein the metal (M') is selected from the group consisting of Zr, Al, La, Pr, Nd, Y, and Sr.

9. The process according to claim 7 wherein the molar ratio M'/(M'+Ce) in the shell of the core-shell particles produced is between 0.01 and 0.15.

10. The process according to claim 1 wherein the temperature in step (b) is maintained between 10° C. and 60° C.

11. The process according to claim 1, wherein the pH in step (b) is maintained between 3 and 11.

12. The process according to claim 1, wherein the molar ratio cerium oxide/cerium (III) before starting step (b) is between 1/1 and 100/1.

13. The process according to claim 1, further comprising, in any order, a step (c) of acidifying and/or a step (d) of washing the dispersion of cerium based core-shell particles.

14. The process according to claim 1, further comprising a step (e) of deagglomeration of the cerium based core-shell particles.

15. The process according to claim 1, further comprising a step (f) of drying the cerium based core-shell particles.

* * * * *